United States Patent
Lee et al.

(10) Patent No.: US 8,698,381 B2
(45) Date of Patent: Apr. 15, 2014

(54) ORGANIC ELECTROLUMINESCENT DISPLAY DEVICE INCLUDING HEAT-RADIATING MEANS

(75) Inventors: Hyun Lee, Gyeongsangbuk-do (KR); Kwon-Min Park, Busan (KR); Yong-Il Kwon, Gyeongsangbuk-do (KR); Hye-Min Park, Changwon-si (KR)

(73) Assignee: LG Display Co., Ltd., Seoul (KR)

( * ) Notice: Subject to any disclaimer, the term of this patent is extended or adjusted under 35 U.S.C. 154(b) by 1067 days.

(21) Appl. No.: 12/591,359

(22) Filed: Nov. 17, 2009

(65) Prior Publication Data

US 2010/0156763 A1     Jun. 24, 2010

(30) Foreign Application Priority Data

Dec. 22, 2008 (KR) .................. 10-2008-0131126

(51) Int. Cl.
*H01L 51/50* (2006.01)
*H01L 51/52* (2006.01)

(52) U.S. Cl.
CPC .................. *H01L 51/529* (2013.01)
USPC .......................... 313/46; 313/504

(58) Field of Classification Search
CPC .................................................. H01L 51/529
See application file for complete search history.

(56) References Cited

U.S. PATENT DOCUMENTS

| | | | | |
|---|---|---|---|---|
| 5,990,618 | A * | 11/1999 | Morita et al. | 313/582 |
| 2003/0001488 | A1* | 1/2003 | Sundahl | 313/483 |
| 2004/0016568 | A1* | 1/2004 | Palanisamy | 174/260 |
| 2004/0027057 | A1* | 2/2004 | Sundahl | 313/504 |
| 2005/0068738 | A1* | 3/2005 | Kim et al. | 361/704 |
| 2005/0077615 | A1* | 4/2005 | Yu et al. | 257/706 |
| 2005/0140260 | A1* | 6/2005 | Park et al. | 313/292 |
| 2005/0270436 | A1* | 12/2005 | Miyamura et al. | 349/58 |
| 2006/0132031 | A1* | 6/2006 | Chang et al. | 313/512 |
| 2006/0226773 | A1* | 10/2006 | Kim et al. | 313/512 |
| 2008/0054795 | A1* | 3/2008 | Ohmi et al. | 313/504 |

FOREIGN PATENT DOCUMENTS

| | | |
|---|---|---|
| CN | 1161621 A | 10/1997 |
| CN | 1602151 A | 3/2005 |

* cited by examiner

*Primary Examiner* — Britt D Hanley
(74) *Attorney, Agent, or Firm* — McKenna Long & Aldridge, LLP

(57) ABSTRACT

An organic electroluminescent display device includes an organic electroluminescent display (OLED) panel having a first surface for displaying images and a second surface opposite to the first surface, a thermal pad attached to the second surface, a heat sink attached to the thermal pad such that the thermal pad is disposed between the OLED panel and the heat sink, a bottom case spaced apart from the heat sink and protecting the second surface of the OLED panel, the bottom case formed of a metallic material, and a top case covering edges of the first surface of the OLED panel and combined with the bottom case, wherein a plurality of heat-radiating pins are formed on a surface of the heat sink facing the bottom case.

10 Claims, 7 Drawing Sheets

ORGANIC ELECTROLUMINESCENT DISPLAY DEVICE INCLUDING HEAT-RADIATING MEANS

The present application claims the benefit of Korean Patent Application No. 10-2008-0131126 filed in Korea on Dec. 22, 2008, which is hereby incorporated by reference for all purposes as if fully set forth herein.

BACKGROUND OF THE INVENTION

1. Field of the Invention

The present invention relates to an organic electroluminescent display (OLED) device, and more particularly, to an OLED device including a heat-radiating means.

2. Discussion of the Related Art

Until a recent date, cathode ray tube (CRT) devices have been mainly used as display devices. However, recently, flat panel display devices, such as plasma display panel (PDP) devices, liquid crystal display (LCD) devices and organic electroluminescent display (OLED) devices, have been widely researched and used.

Among the flat panel display devices, organic electroluminescent display (OLED) devices have the advantages of slimness and lightweight because OLED devices are self-luminescent and do not require an additional light source differently from liquid crystal display (LCD) devices.

In addition, as compared to LCD devices, the OLED devices have excellent contrast ratios, wide viewing angles and a short response time. The OLED devices are advantageous in power consumption and are driven by low direct current (DC) voltages. Since the OLED devices solid state devices, the OLEDs sufficiently withstand external impact and have greater operational temperature ranges. Furthermore, due to their simple fabricating process, the fabrication costs of the OLED devices are low when compared with those of LCD devices.

The OLED devices are classified into a passive matrix type and an active matrix type. In the passive matrix type, scan lines and signal lines cross each other to form diodes in a matrix shape. On the other hand, in the active matrix type, a switching thin film transistor for turning on/off a pixel, a driving thin film transistor for flowing currents, and a capacitor for maintaining voltages applied to the driving thin film transistor during a frame are formed at each pixel. The passive matrix type devices have limitations on the display resolution, power consumption, lifetime, and so on, and the active matrix type devices has been researched and developed because of their low power consumption, high definition and large-sized possibility.

The OLED devices are commonly categorized as top emission-type and bottom emission-type according to a direction of the emitted light. The bottom emission-type devices have advantages in the stability and fabrication method. However, it is difficult to adopt the bottom emission-type devices into high definition products because of their restricted aperture ratio. Accordingly, the top emission-type devices have been widely used for high definition and high aperture ratio products.

FIG. 1 is a cross-sectional view illustrating an active matrix type OLED panel according to the related art. The related art OLED panel is a top emission-type.

In FIG. 1, the OLED panel 10 includes a first substrate 1 and a second substrate 2 facing the first substrate 1. The first and second substrates 1 and 2 are spaced apart from each other and are attached such that a seal pattern 20 seals edges thereof.

More particularly, a driving thin film transistor DTr is formed at each pixel region P on the first substrate 1, and a connection electrode 3 is connected to the driving thin film transistor DTr.

A first electrode 5, an organic luminescent layer 7 on the first electrode 5, and a second electrode 9 on the organic luminescent layer 7 are formed on an inner surface of the second substrate 2 facing the first substrate 1. The organic luminescent layer 7 emits a predetermined color light at each pixel region P. A partition wall (not shown) may be formed between adjacent pixel regions P on the first electrode 5. When the partition wall is formed, the organic luminescent layer 7 and the second electrode 9 may be patterned and separated at each pixel region P without a patterning process.

In general, to show red, green or blue color, the organic luminescent layer 7 may include organic materials emitting red, green and blue and patterned at the pixel regions.

The first and second electrodes 5 and 9 and the organic luminescent layer 7 constitute an organic light-emitting diode E. In the OLED panel having the above mentioned structure, the first electrode 5 functions as a cathode electrode, and the second electrode 9 serves as an anode electrode.

The driving thin film transistor DTr on the first substrate 1 is electrically connected to the organic light-emitting diode E on the second substrate 2 through a connection pattern 11. The connection pattern 11 connects the organic light-emitting diode E and the driving thin film transistor DTr across a gap between the first and second substrates 1 and 2.

Here, the second substrate 2 may be omitted to provide a flexible OLED device.

However, in the OLED panel 10, the lifespan may be rapidly decreased due to degradation of the driving thin film transistor DTr and heats generated when the OLED panel 10 is driven.

To solve the problem, various heat-radiating means have been suggested, and for example, a fan or heat pipe is added to a modularizing tool of the OLED panel. This heat-radiating means have some disadvantages. That is, the heat-radiating means has relatively weak effects for costs, and the structure and setting-up are complicated. In addition, the heat-radiating means increases the weight and thickness of the display device.

SUMMARY OF THE INVENTION

Accordingly, the present invention is directed to an organic electroluminescent display (OLED) device that substantially obviates one or more of the problems due to limitations and disadvantages of the related art.

An advantage of the present invention is to provide an OLED device that effectively radiates heats.

Another advantage is to provide an OLED device that has a relatively thin thickness and light weight.

Another advantage is to provide an OLED device that reduces manufacturing costs.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display device includes an organic electroluminescent display (OLED) panel having a first surface for displaying images and a second surface opposite to the first surface, a thermal pad attached to the second surface, a heat sink attached to the thermal pad such that the thermal pad is disposed between the OLED panel and the heat sink, a bottom case spaced apart from the heat sink and protecting the second surface of the OLED panel, the bottom case formed of a metallic material, and a top case covering edges of the first surface of the OLED panel and combined with the bottom case, wherein a plurality of heat-radiating pins are formed on a surface of the heat sink facing the bottom case.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 1:
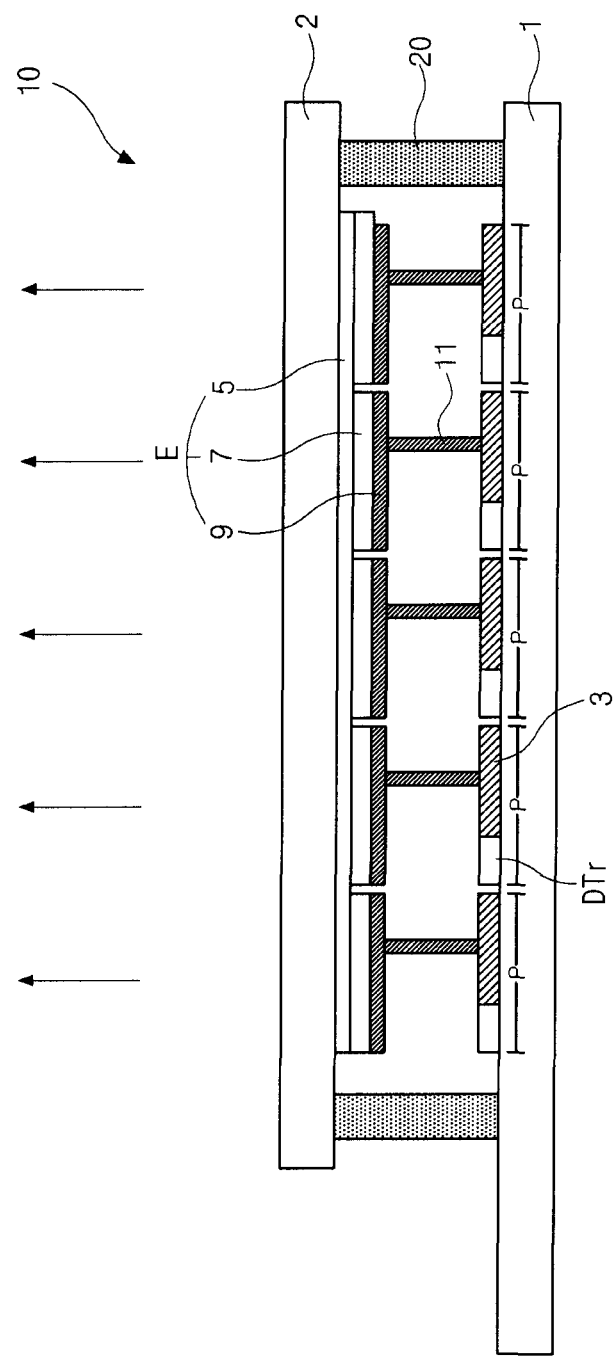
FIG. 1 is a cross-sectional view illustrating an active matrix type OLED panel according to the related art.
Figure 2:
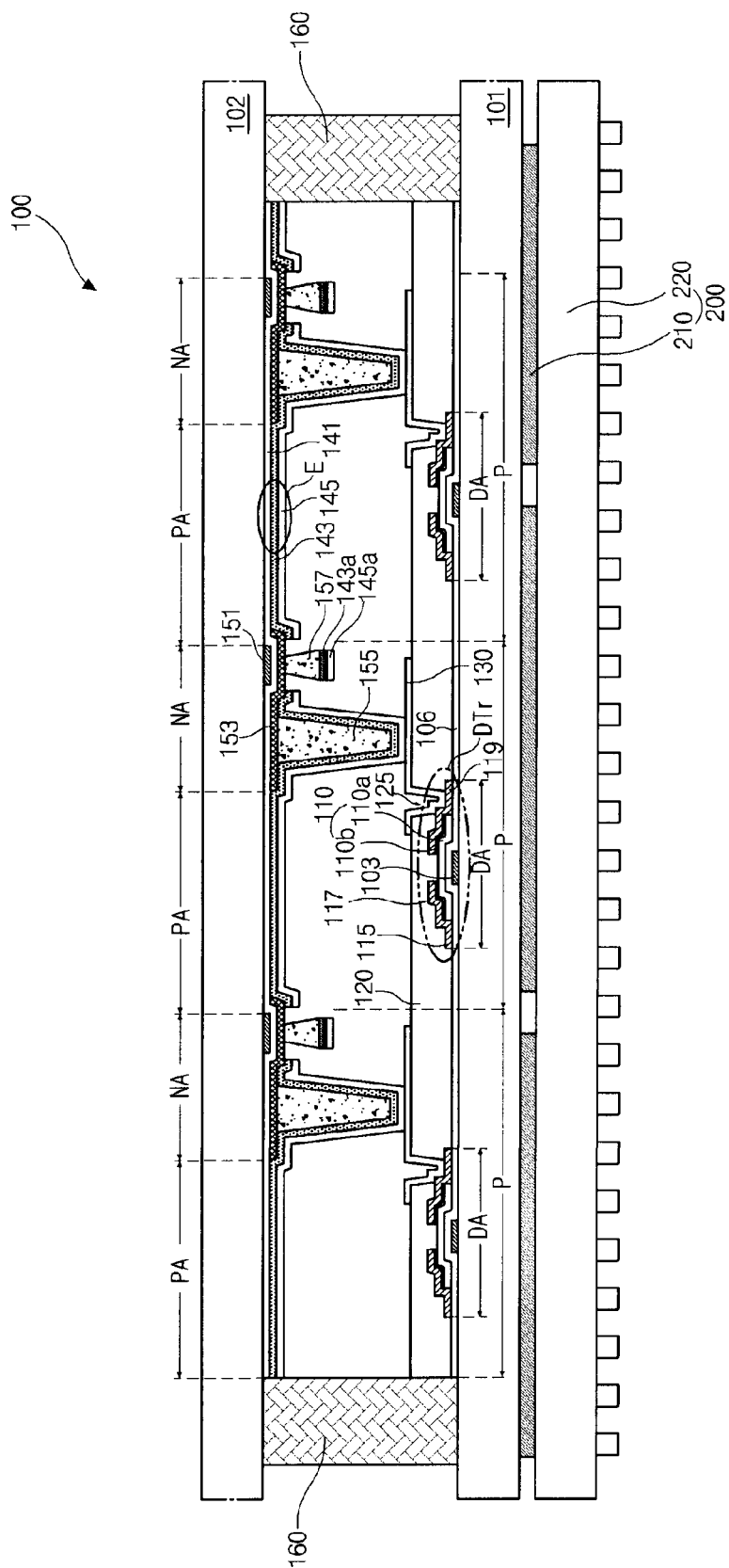
FIG. 2 is a cross-sectional view of a top emission-type OLED panel according to a first embodiment of the present invention.

FIG. 2 is a cross-sectional view of a top emission-type OLED panel according to a first embodiment of the present invention.

For convenience of explanation, a driving region DA, a non-emission region NA, an emission region PA are defined. A driving thin film transistor is formed in the driving region DA, a connection pattern is formed in the non-emission region NA, and an organic light-emitting diode E is formed in the emission region PA. Although not shown in the figure, a switching region, where a switching thin film transistor is formed, is further defined.

In FIG. 2, the OLED panel 100 includes a first substrate 101 and a second substrate 102 facing and spaced apart from each other. A driving thin film transistor DTr and a switching thin film transistor are formed on the first substrate 101, and an organic light-emitting diode E is formed is formed on the second substrate 102. The first and second substrates 101 and 102 are attached by a seal pattern 160 of a thermohardening resin or an UV curable resin at peripheries thereof.

Gate lines (not shown) and data lines 115 are formed on the first substrate 101 and cross each other to define pixel regions P. A switching thin film transistor (not shown) is formed at each crossing portion of the gate lines and the data lines 115 as a switching element, and a driving thin film transistor DTr is electrically connected to the switching thin film transistor. The driving thin film transistor DTr includes a gate electrode 103 connected to the switching thin film transistor, an gate insulating layer 106 on the gate electrode 103, a semiconductor layer 110 on the gate insulating layer 106, and source and drain electrodes 117 and 119 on the semiconductor layer 110. The semiconductor layer 110 includes an active layer 110a of intrinsic amorphous silicon and ohmic contact layers 110b of impurity-doped amorphous silicon.

A passivation layer 120 is formed over the switching thin film transistor and the driving thin film transistor DTr. The passivation layer 120 has a drain contact hole 125 exposing the drain electrode 119 of the driving thin film transistor DTr.

The passivation layer 120 is formed of one selected from an inorganic insulating material group including silicon oxide ($SiO_2$) and silicon nitride (SiNx). As occasion demands, the passivation layer 120 may be formed of one selected from an organic insulating material group including benzocyclobutene (BCB) and photo acryl.

A connection electrode 130 is formed in each pixel region P on the passivation layer 120. The connection electrode 130 is connected to the drain electrode 119 through the drain contact hole 125.

An auxiliary electrode 151 is formed in each non-emission region NA on the second substrate 102 facing the first substrate 101. A first electrode 141 is formed on a substantially entire surface of the second substrate 102 including the auxiliary electrode 151 as an element of the organic light-emitting diode E. The first electrode 141 may function as an anode electrode. The first electrode 141 may be formed of a material having relatively high work function such as indium-tin-oxide (ITO).

A buffer layer 153 is formed on the first electrode 141 in the non-emission region NA.

A connection pattern 155 is formed on the buffer layer 153 in the non-emission region NA. The connection pattern 155 electrically connects the driving thin film transistor DTr and the organic light-emitting diode E to provide currents to the organic light-emitting diode E.

A partition wall 157 is formed on the buffer layer 153 in the non-emission region NA and surrounds a boundary of each pixel region P. The partition wall 157 has a predetermine thickness.

An organic luminescent layer 143 and a second electrode 154 are sequentially formed on the first electrode 141 in each pixel region P.

The first and second electrodes 141 and 145 and the organic luminescent layer 143 interposed therebetween constitute the organic light-emitting diode E.

The organic luminescent layer 143 and the second electrode 154 may be automatically separated by the partition wall 157 without a mask process. There exist an organic luminescent material layer 143a and a metallic material layer 145a on the partition wall 157.

Since the first electrode 141 of the organic light-emitting diode E is formed of a transparent conductive material such as ITO, lights emitted from the organic luminescent layer 143 are emanated through the first electrode 141, and the OLED panel is a top-emission type.

Here, the organic luminescent layer 143 may have a single-layered structure of a luminous material. To increase emission efficiency, the organic luminescent layer 143 may have a multiple-layered structure including a hole injection layer, a hole transportation layer, an emission layer, an electron transportation layer, and an electron injection layer.

The second electrode 145 may function as a cathode electrode and may be formed of a metallic material having relatively low work function such as aluminum (Al) or aluminum alloy of aluminum neodymium (AlNd).

The second electrode 145 right over the connection pattern 155 contacts the connection electrode 130 over the first substrate 101.

The connection pattern 155 has a columnar shape and a predetermined thickness. The connection pattern 155 maintains a gap between the first and second substrates 101 and 102 and electrically connects the first and second substrates 101 and 102.

More particularly, the connection electrode 130, which is connected to the drain electrode 119 of the driving thin film transistor DTr, contacts the second electrode 145, which covers the connection pattern 155. Accordingly, the organic light-emitting diode E on the second substrate 102 is electrically connected to the driving thin film transistor DTr on the first substrate 101.

The first substrate 101, which has the switching thin film transistor and the driving thin film transistor DTr, and the second substrate 102, which has the organic light-emitting diode E, are manufactured separately and then attached to each other, thereby completing the OLED panel 100.

In the OLED panel 100, voltages are respectively applied to the first and second electrodes 141 and 145 according to a signal for a selected color, and holes injected from the first electrode 141 and electrons injected from the second electrode 145 are transported to the organic luminescent layer 143 to generate excitons. When the excitons transition from an excited state to a ground state, lights are generated and emitted as visible rays.

The emitted lights are emanated through the transparent first electrode 141 to the outside, and images are displayed through an outer surface of the second substrate 102.

A heat-radiating means 200 is attached to an outer surface of the first substrate 101 and releases heats generated in the OLED panel 100.

A temperature of the OLED panel 100 increases up to about 80 to 90 degrees of Celsius due to the degradation of the driving thin film transistor DTr and heats generated when the OLED panel 100 is driven. This shortens the lifespan of the OLED panel 100.

Accordingly, in the present invention, the heat-radiating means 200 is disposed at a surface of the OLED panel 100 through which the images are not displayed. The heats generated in the OLED panel 100 are radiated, and the lifespan of the OLED panel 100 is prevented from being shortened.

The heat-radiating means 200 includes a thermal pad 210 and a heat sink 220. The thermal pad 210 is attached to a rear surface of the OLED panel 100, that is, the outer surface of the first substrate 101, and the heat sink contacts the thermal pad 210. Accordingly, the heats generated in the OLED panel 100 are effectively released to the outside through the thermal pad 210 and the heat sink 220.

This will be explained in more detain hereinafter with reference to FIGS. 3 and 4.

Figure 3:
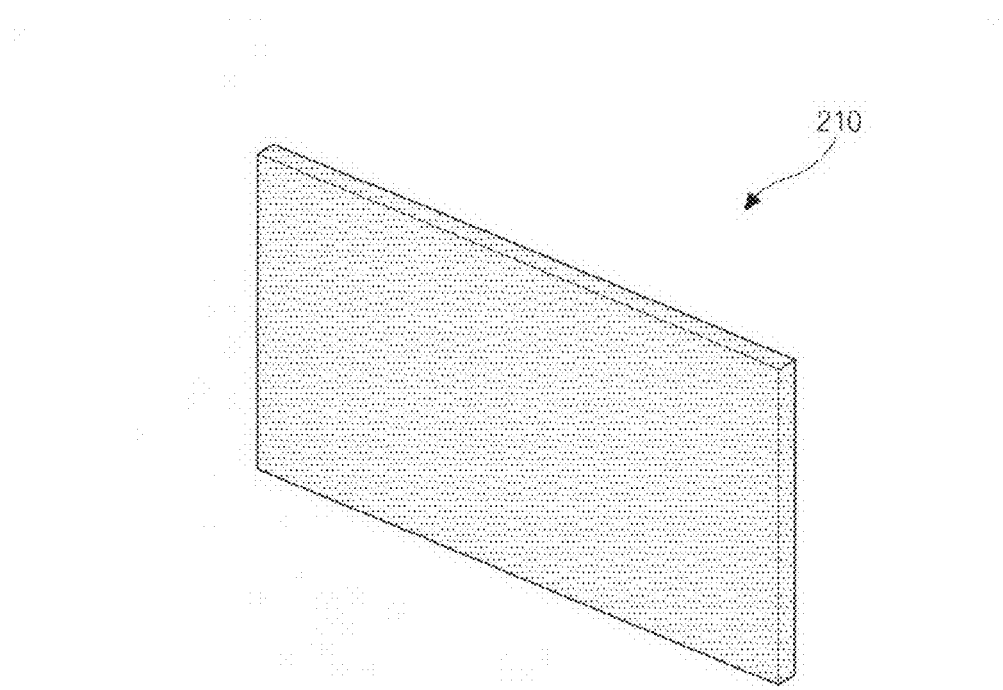
FIG. 3 is a view of schematically illustrating a thermal pad according to the present invention.

FIG. 3 is a view of schematically illustrating a thermal pad according to the present invention.

In FIG. 3, the thermal pad 210 is attached to a rear surface of the OLED panel 100 of FIG. 2. The thermal pad 210 may be formed of a ductile material, for example, a thermal interface material (TIM). TIM has relatively good interface properties and high thermal conductivity and includes a silicon-based material.

By using TIM as the thermal pad 210, the thermal pad 210 may make a plane contact with the OLED panel 100 of FIG. 2 along an entire contact surface.

More particularly, the rear surface of the OLED panel 100 of FIG. 2 has roughness. If the thermal pad 210 is rigid, a surface of the thermal pad 210 may also have roughness. In this case, the thermal pad 210 may make a point contact with the OLED panel 100 of FIG. 2, and there may be an air pocket between the thermal pad 210 and the rear surface of the OLED panel 100 of FIG. 2.

On the other hand, if the thermal pad 210 is formed of TIM, the thermal pad 210 may be soft. The thermal pad 210 may make substantially uniformly and continuously contact the OLED panel 100 of FIG. 2 without the air pocket between the thermal pad 210 and the OLED panel 100 of FIG. 2. Accordingly, the contact surface is maximized.

Moreover, a path for carrying the heats is expanded by the entire contact surface of the thermal pad 210 and the OLED panel 100 of FIG. 2, and thermal contact resistance is considerably decreased. Therefore, the heats generated in the OLED panel 100 of FIG. 2 are effectively conducted to the thermal pad 210.

The thermal pad 210 may have the same size as the rear surface of the OLED panel 100 of FIG. 2 to completely cover the rear surface of the OLED panel 100 of FIG. 2. By the way, the thermal pad 210 may be attached to the rear surface of the OLED panel 100 of FIG. 2 by hands of a worker because it is not easy to perform an automatic process. There may be poor attachments during the process.

Thus, the thermal pad 210 may be divided into several pieces, for example, two or three pieces, which are spaced apart from each other, and may be attached to the rear surface of the OLED panel 100 of FIG. 2. The process may be efficiently performed.

A surface of the heat sink 220 of FIG. 2 contacting the thermal pad 210 also has roughness. Since the thermal pad 210 has the ductility, the thermal pad 210 may have a plane contact with the heat sink 220 of FIG. 2 along a contact surface.

Therefore, the heats generated in the OLED panel 100 of FIG. 2 are effectively conducted to the heat sink 220 of FIG. 2.

Figure 4A:
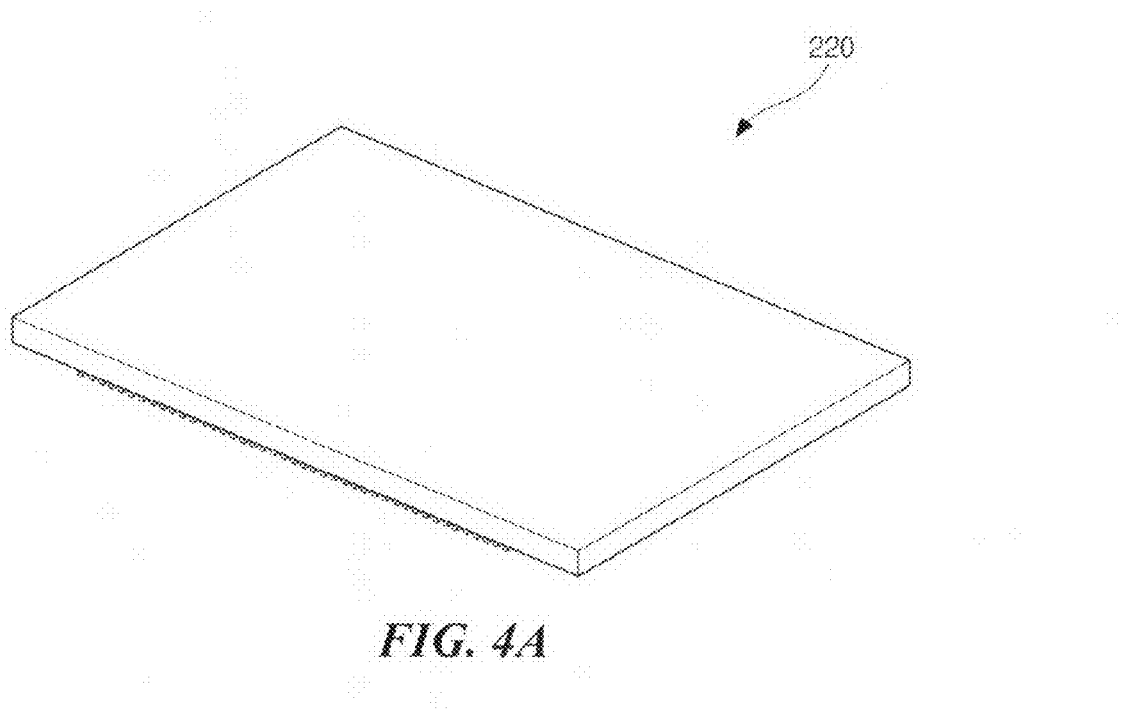
FIG. 4A is a top-viewed perspective view of schematically illustrating a heat sink according to the present invention.
Figure 4B:
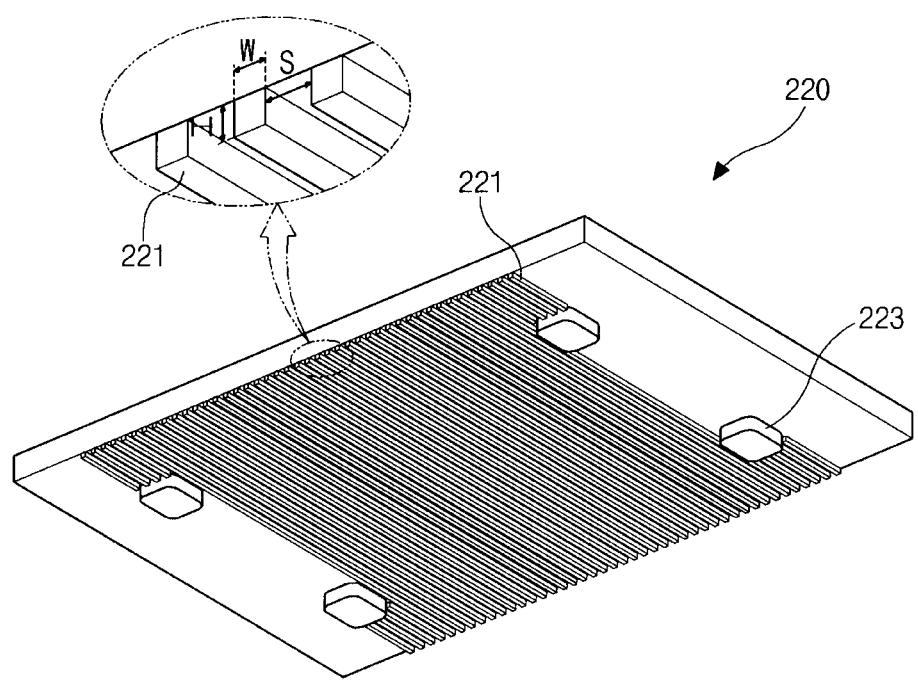
FIG. 4B is a bottom-viewed perspective view of schematically illustrating a heat sink according to the present invention.

FIG. 4A is a top-viewed perspective view of schematically illustrating a heat sink according to the present invention, and FIG. 4B is a bottom-viewed perspective view of schematically illustrating a heat sink according to the present invention.

In FIG. 4A, the heat sink 220 has a rectangular plate shape corresponding to the rear surface of the OLED panel 100 of FIG. 2. The heat sink 220 may be formed of a metallic material having relatively high thermal conductivity, for example, aluminum (Al). The aluminum may have purity of about 99.5%.

The heat sink 220, beneficially, may be anodized, and a black oxidation film may be formed at a surface of the heat sink 220. Since the heat sink 220 is black, a heat-absorbing efficiency is increased, and the heat sink 220 has relatively high thermal conductivity.

The heats transferred to the heat sink 220 are spread effectively all over the heat sink 220.

In FIG. 4B, a plurality of heat-radiating pins 221 are formed on a rear surface of the heat sink 220 opposite to a front surface of the heat sink 220 contacting the thermal pad 210 of FIG. 3. The heat-radiating pins 221 are spaced apart from each other and projected from the rear surface of the heat sink 220 with a predetermined height.

The heat-radiating pins 221 may have various shapes. It is desirable that the heat-radiating pins 221 are protruded to face a direction for conducting heats and to have a maximized surface area.

As the number of the heat-radiating pins 221 increases, the surface area for radiating the heats conducted to the heat-radiating pins 221 increases, and a high heat-radiating effect can be obtained. The number of the heat-radiating pins 221 is within such a range that natural convection passes between adjacent heat-radiating pins 221.

For example, in the present invention, the heat-radiating pins 221 may be protruded from the rear surface of the heat sink 220 with the height H of at least 1 to 2 mm. A width W of the heat-radiating pins 221 may be within a range of 1 to 2 mm, and a distance S between adjacent heat-radiating pins 221 may be within a range of 2 to 3 mm.

Accordingly, natural convection passes between adjacent heat-radiating pins 221, and some of the heats conducted to the heat sink 220 can be released.

To further increase the heat-radiating effect of the heat sink 220, it is beneficial to release the heats conducted to the heat sink 220 to the outside through a modularizing tool of the OLED panel 100 of FIG. 2. To do this, heat-radiating contact terminals 223 may be formed at four corner areas of the rear surface of the heat sink 220.

The heat-radiating contact terminals 223 may be projected from the rear surface of the heat sink 220 with a higher height than the heat-radiating pins 221. When the heat-radiating contact terminals 223 contacts the modularizing tool of the OLED panel 100 of FIG. 2, the heat-radiating pins 221 do not contact the modularizing tool of the OLED panel 100 of FIG. 2, and there is a gap between the heat-radiating pins 221 and the modularizing tool.

Here, the modularizing tool of the OLED panel 100 of FIG. 2 may be a top case and a bottom case.

Figure 5:
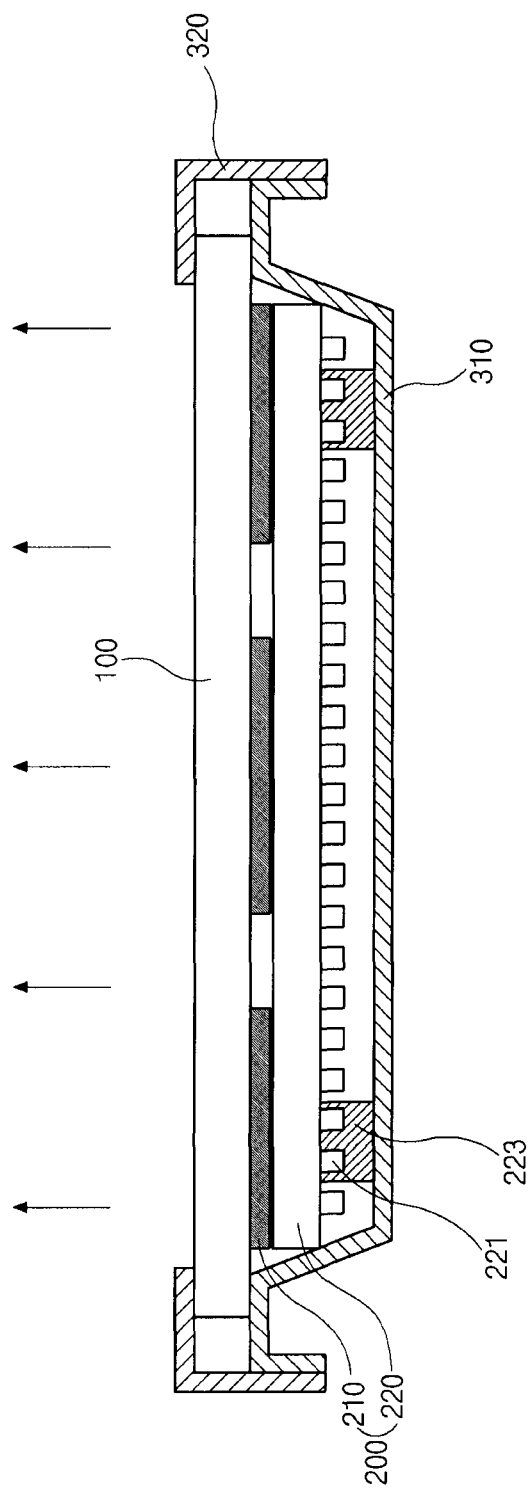
FIG. 5 is a view of schematically illustrating an OLED panel modularized by a top case and a bottom case according to the present invention.

FIG. 5 is a view of schematically illustrating an OLED panel modularized by a top case and a bottom case according to the present invention.

In FIG. 5, a heat-radiating means 220 is disposed at a rear surface of an OLED panel 100. The heat-radiating means 220 includes a thermal pad 210 attached to the rear surface of the LED panel 100 and a heat sink 220 attached to a rear surface of the thermal pad 210.

A plurality of heat-radiating pins 221 and heat-radiating contact terminals 223 are formed on the rear surface of the heat sink 220.

The OLED panel 100 and the heat-radiating means 220 are modularized by a top case 320 and a bottom case 310. The top case 320 has a rectangular frame shape with an L-shaped cross-section to cover edges of a front surface and side surfaces of the OLED panel 100. A front surface of the top case 320 has an opening, wherein images of the OLED panel 100 are displayed through the opening. The top case 320 may be formed of a metallic material.

The bottom case 310, which the OLED panel 100 and the heat-radiating means 200 are disposed over and which is a base of an OLED module, has a rectangular plate shape, and edges of the bottom case 310 are bent toward the OLED panel 100. Thus, the bottom case 310 may include a bottom wall and side walls. The bottom case 310 protects a rear side of the OLED panel 100. The bottom case 310 may be formed of a metallic material.

The heat-radiating contact terminals 223 formed on the rear surface of the heat sink 220 contacts the bottom case 310 of a metallic material. Accordingly, a path of transmitting heats can be obtained from the OLED panel 100 to the bottom case 310. Namely, heats generated in the OLED panel 100 are effectively conducted to the bottom case 310 through the heat-radiating means 200 and released to the outside.

Here, the top case 320 may be referred to as a case top or a top cover, and the bottom case 310 may be referred to as a cover bottom, a bottom cover or a lower cover.

Figure 6:
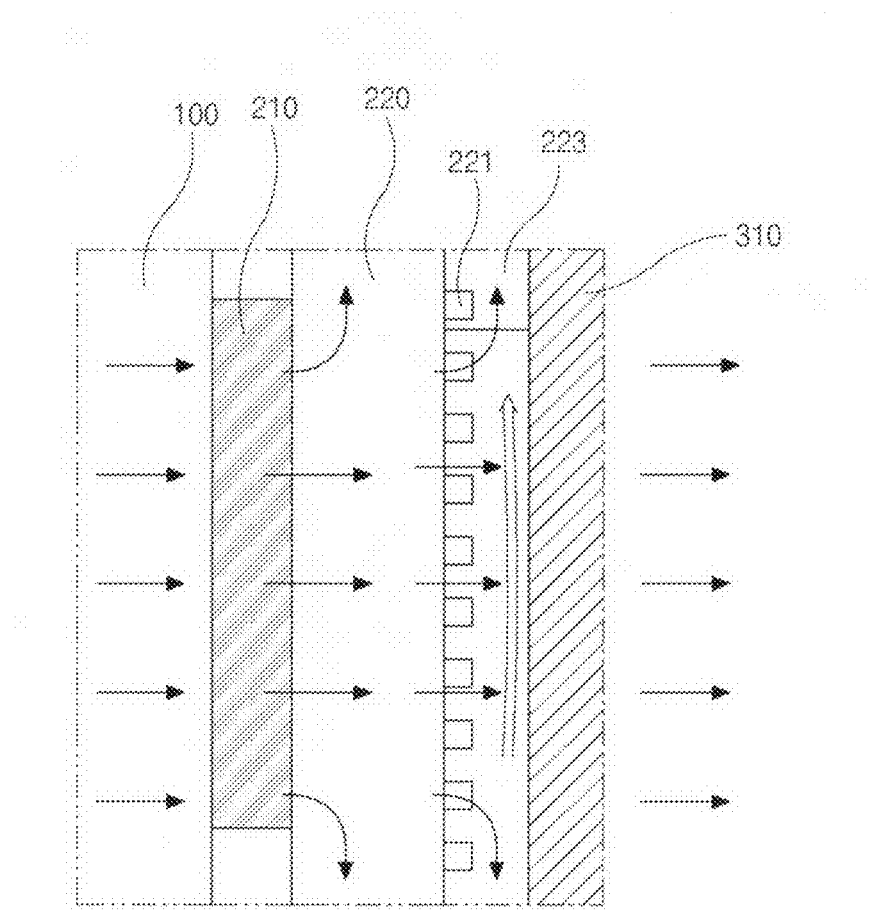
FIG. 6 is a view of schematically illustrating a path of transmitting heats from an OLED panel to a bottom case according to the present invention.

FIG. 6 is a view of schematically illustrating a path of transmitting heats from an OLED panel to a bottom case according to the present invention.

In FIG. 6, the heats generated in the OLED panel 100 are conducted to the heat sink 220 through the thermal pad 210. Some of the heats conducted to the heat sink 220 are radiated by natural convection passes between adjacent heat-radiating pins 221, and other of the heats are released to the outside through the bottom case 310 of a metallic material contacting the heat-radiating contact terminals 223 of the heat sink 220.

Therefore, while the temperature of the related art OLED panel goes up to more than 80 to 90 degrees of Celsius, the temperate of the OLED panel 100 may go up to 55 to 60 degrees of Celsius due to the heat-radiating means 200.

Meanwhile, in the first embodiment of the present invention, even though the heat-radiating means 200 contacts the bottom case 310, the heat-radiating means 200 may be formed to contact the top case 320.

In addition, in the first embodiment of the present invention, the driving thin film transistor DTr of FIG. 2 and the organic light-emitting diode E of FIG. 2 are formed on different substrates. In another embodiment, the driving thin film transistor and the organic light-emitting diode may be formed on the same substrate.

Figure 7:
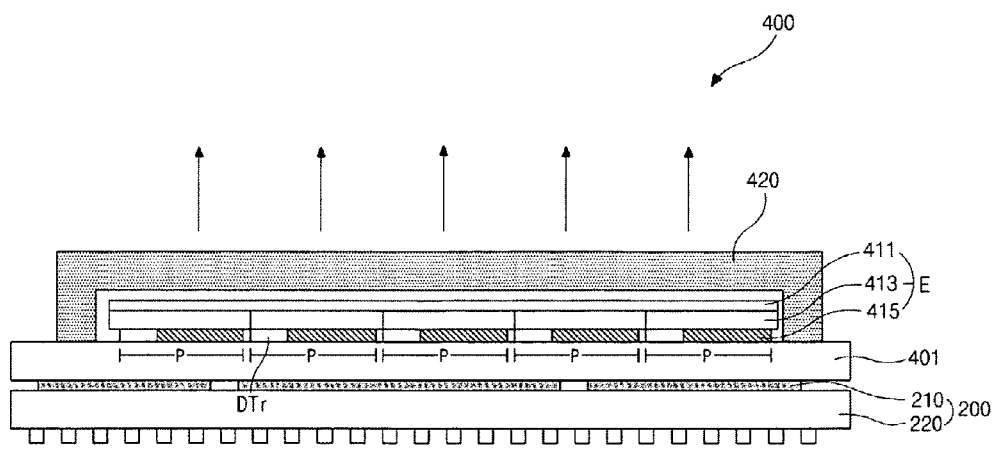
FIG. 7 is a cross-sectional view of a top emission-type OLED panel according to a second embodiment of the present invention.

FIG. 7 is a cross-sectional view of a top emission-type OLED panel according to a second embodiment of the present invention. For convenience of explanation, the same parts as the first embodiment will be summarily explained.

In FIG. 7, the OLED panel 400 includes a driving thin film transistor DTr and an organic light-emitting diode E formed on the same substrate 401.

A second electrode 415, an organic luminescent layer 413 and a first electrode 411 are sequentially formed on an inner surface of the substrate 401 and constitute the organic light-emitting diode E. The second electrode 415 is electrically connected to the driving thin film transistor DTr.

Here, the second electrode 415 may be formed of an opaque conductive material, and the first electrode 411 may be formed of a transparent conductive material. Accordingly, lights emitted from the organic luminescent layer 413 are emanated through the first electrode 411.

A transparent passivation film 420 may be formed to cover a display area of the substrate 401 having the organic light-emitting diode E.

As stated above, the lights are emanated toward a direction from the substrate 401 to the passivation film 420 to thereby display images. Therefore, an outer surface of the passivation film 420 is a display surface.

A heat-radiating means 200 is attached to an outer surface of the substrate 401 and releases the heats generated in the OLED panel 400.

In the meantime, a counter substrate facing the substrate 401 may be disposed instead of the passivation film 420. At this time, the counter substrate may be attached with the substrate 401 by a seal pattern (not shown).

In the second embodiment, the heat-radiating means 200 is positioned on the rear surface of the substrate 401 including the driving thin film transistor DTr. The heat-radiating means 200 may be disposed on an outer surface of a substrate facing the substrate 401 that includes the driving thin film transistor DTr. This will be explained hereafter with reference to FIG. 8.

Figure 8:
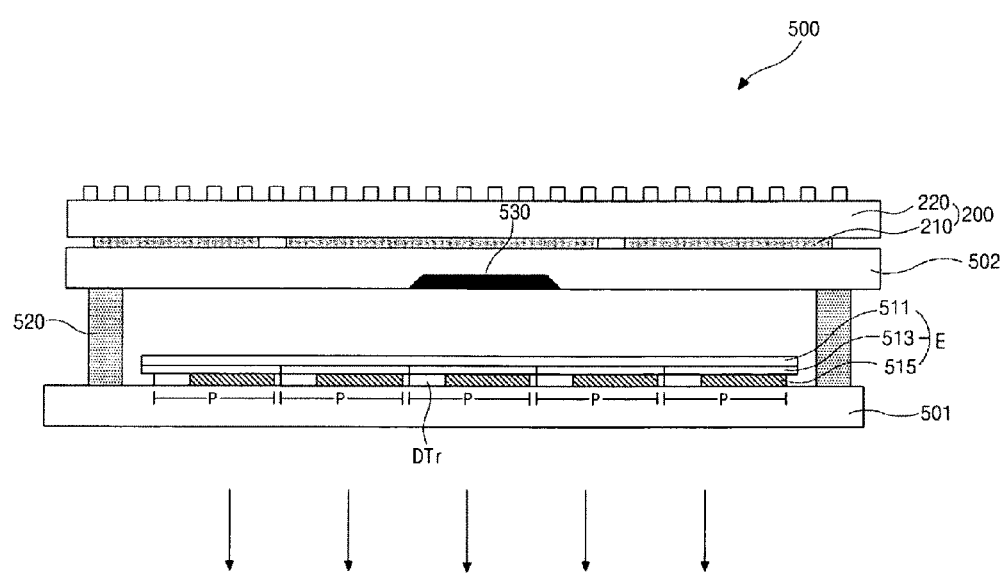
FIG. 8 is a cross-sectional view of a bottom emission-type OLED panel according to a third embodiment of the present invention.

FIG. 8 is a cross-sectional view of a bottom emission-type OLED panel according to a third embodiment of the present invention. For convenience of explanation, the same parts as the first and second embodiments will be summarily explained.

In FIG. 8, an organic light-emitting diode E and a driving thin film transistor DTr are formed on the same substrate, that is, on a first substrate 501.

A second electrode 515, an organic luminescent layer 513 and a first electrode 511 are sequentially formed on an inner surface of the first substrate 501 and constitute the organic light-emitting diode E. The second electrode 515 is electrically connected to the driving thin film transistor DTr.

Here, the second electrode 515 may be formed of a transparent conductive material, and the first electrode 511 may be formed of an opaque conductive material. Accordingly, lights emitted from the organic luminescent layer 513 are emanated through the second electrode 511.

A second substrate 502 is spaced apart from the first substrate 501. A moisture-absorbing means 530 may be attached to an inner surface of the second substrate 502. The moisture-absorbing means 530 removes moisture and oxygen in the OLED panel 500.

In the OLED panel 500, the lights are emanated toward a direction from the second substrate 502 to the first substrate 501 to thereby display images. Therefore, an outer surface of the first substrate 501 is a display surface.

A heat-radiating means 200 is attached to an outer surface of the second substrate 502 and releases the heats generated in the OLED panel 500.

As mentioned above, in the present invention, the heat-radiating means 200 including the thermal pad 210 and the heat sink 220 is disposed at the outer surface of a side of the OLED panel that does not display images, and thus the path of transmitting heats can be obtained from the OLED panel to the bottom case. Accordingly, the heats generated in the OLED panel are effectively released to the outside, and the heat-radiating effect can be maximized.

Moreover, the heat-radiating means 200 has a simple structure and is easily set up. As compared with the fan or heat pipe of the related art, the heat-radiating effect may be relatively high, and a display device having light weight and thin thickness can be obtained.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
   an organic electroluminescent display (OLED) panel having a first surface for displaying images and a second surface opposite to the first surface;
   a thermal pad attache'd to the second surface;
   a heat sink attached to the thermal pad such that the thermal pad is disposed between the OLED panel and the heat sink;
   a bottom case spaced apart from the heat sink and protecting the second surface of the OLED panel, the bottom case formed of a metallic material; and
   a top case covering edges of the first surface of the OLED panel and combined with the bottom case,
   wherein a plurality of heat-radiating pins are formed on a surface of the heat sink facing the bottom case, and
   wherein the thermal pad is formed of a ductile thermal interface material including a silicon-based material, the thermal pad directly contacts the OLED panel, and there is no air pocket between the thermal pad and the OLED panel.

2. The device according to claim 1, wherein the thermal pad has a size corresponding to the second surface of the OLED panel.

3. The device according to claim 1, wherein thermal pad is divided into several pieces that are spaced apart from each other.

4. The device according to claim 1, wherein the heat sink has a plate shape and a size corresponding to the second surface of the OLED panel.

5. The device according to claim 1, wherein the plurality of heat-radiating pins are protruded from the heat sink and spaced apart from each other.

6. The device according to claim 5, wherein heat-radiating contact terminals are formed on the surface of the heat sink facing the bottom case and contact the bottom case.

7. The device according to claim 6, wherein the heat-radiating contact terminals have a higher height than the plurality of heat-radiating pins such that the plurality of heat-radiating pins are spaced apart from the bottom case.

8. The device according to claim 6, wherein the heat-radiating contact terminals are disposed at four corner areas of the surface of the heat sink facing the bottom case.

9. The device according to claim 1, wherein the OLED panel includes:
   first and second substrates facing each other;
   a switching thin film transistor and a driving thin film transistor on an inner surface of the first substrate; and
   an organic light-emitting diode on an inner surface of the second substrate,
   wherein lights emitted from the light-emitting diode are emanated through the second substrate.

10. The device according to claim 1, wherein the OLED panel includes:
    first and second substrates facing each other; and
    a switching thin film transistor, a driving thin film transistor and an organic light-emitting diode on an inner surface of the first substrate,
    wherein lights emitted from the light-emitting diode are emanated through the second substrate.

\* \* \* \* \*